(12) United States Patent
Lu et al.

(10) Patent No.: US 10,727,222 B2
(45) Date of Patent: Jul. 28, 2020

(54) MEMORY SYSTEM AND MEMORY CELL HAVING DENSE LAYOUTS

(71) Applicant: Taiwan Semiconductor Manufacturing Co., Ltd., Hsinchu (TW)

(72) Inventors: Hau-Yan Lu, Hsinchu (TW); Shih-Hsien Chen, Zhubei (TW); Chun-Yao Ko, Hsinchu (TW); Felix Ying-Kit Tsui, Cupertino, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/492,508

(22) Filed: Apr. 20, 2017

(65) Prior Publication Data
US 2018/0308847 A1    Oct. 25, 2018

(51) Int. Cl.
| H01L 27/06 | (2006.01) |
| H01L 49/02 | (2006.01) |
| H01L 29/94 | (2006.01) |
| H01L 27/11524 | (2017.01) |
| H01L 29/423 | (2006.01) |

(52) U.S. Cl.
CPC .... *H01L 27/0629* (2013.01); *H01L 27/11524* (2013.01); *H01L 28/60* (2013.01); *H01L 29/42324* (2013.01); *H01L 29/94* (2013.01)

(58) Field of Classification Search
CPC .................................................... H01L 27/115
USPC ............................................. 365/149, 51, 63
See application file for complete search history.

(56) References Cited

U.S. PATENT DOCUMENTS

| 6,151,244 A * | 11/2000 | Fujino ................... G11C 11/401 365/149 |
| 2011/0157961 A1* | 6/2011 | Yamazaki ............... H01L 21/84 365/149 |
| 2011/0255328 A1* | 10/2011 | Murakuki ............. H01L 27/105 365/145 |
| 2014/0016399 A1* | 1/2014 | Lu ........................... G11C 8/14 365/149 |
| 2015/0098266 A1* | 4/2015 | Chen ..................... G11C 11/401 365/149 |

* cited by examiner

*Primary Examiner* — Sheng-Bai Zhu
(74) *Attorney, Agent, or Firm* — McClure, Qualey & Rodack, LLP

(57) ABSTRACT

A memory system is provided. The memory system includes a number of memory cells and a number of bit lines. The memory cells are interlocked with each other in rows and columns. The memory cells include respective capacitors, respective first transistors and respective second transistors. Respective upper plates of the respective capacitors are electrically connected to respective gates of the respective first transistors, and respective drains of the respective second transistors are connected to respective sources of the respective first transistors. The bit lines are arranged along an extending direction of the rows. Respective bit lines are connected to the respective first transistors through respective bit-line contacts, and each of the respective bit-line contacts is shared by two adjacent memory cells of the extending direction of the rows.

20 Claims, 6 Drawing Sheets

MEMORY SYSTEM AND MEMORY CELL HAVING DENSE LAYOUTS

BACKGROUND

Semiconductor devices are used in a variety of electronic applications, such as personal computers, cell phones, digital cameras, and other electronic equipment. Memory devices are one type of semiconductor device. Memory devices typically include an array of memory cells, with each memory cell being adapted to store digital information or data as "1" or "0". Some memory devices are referred to as volatile memories because of their need to be refreshed to retain the data, while others are referred to as non-volatile memories (NVMs) because they do not require refreshing.

A recent development in NVMs is multiple-time programmable (MTP) NVMs, which are programmable multiple times. In comparison with high density NVM (such as flash memory or E2PROMS), MTP memories are suitable for low-density applications, and are usually characterized by a higher memory cell size and a lower number of masking operations required to manufacture the memory cells. However, there are still challenges in operating the NVMs properly.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
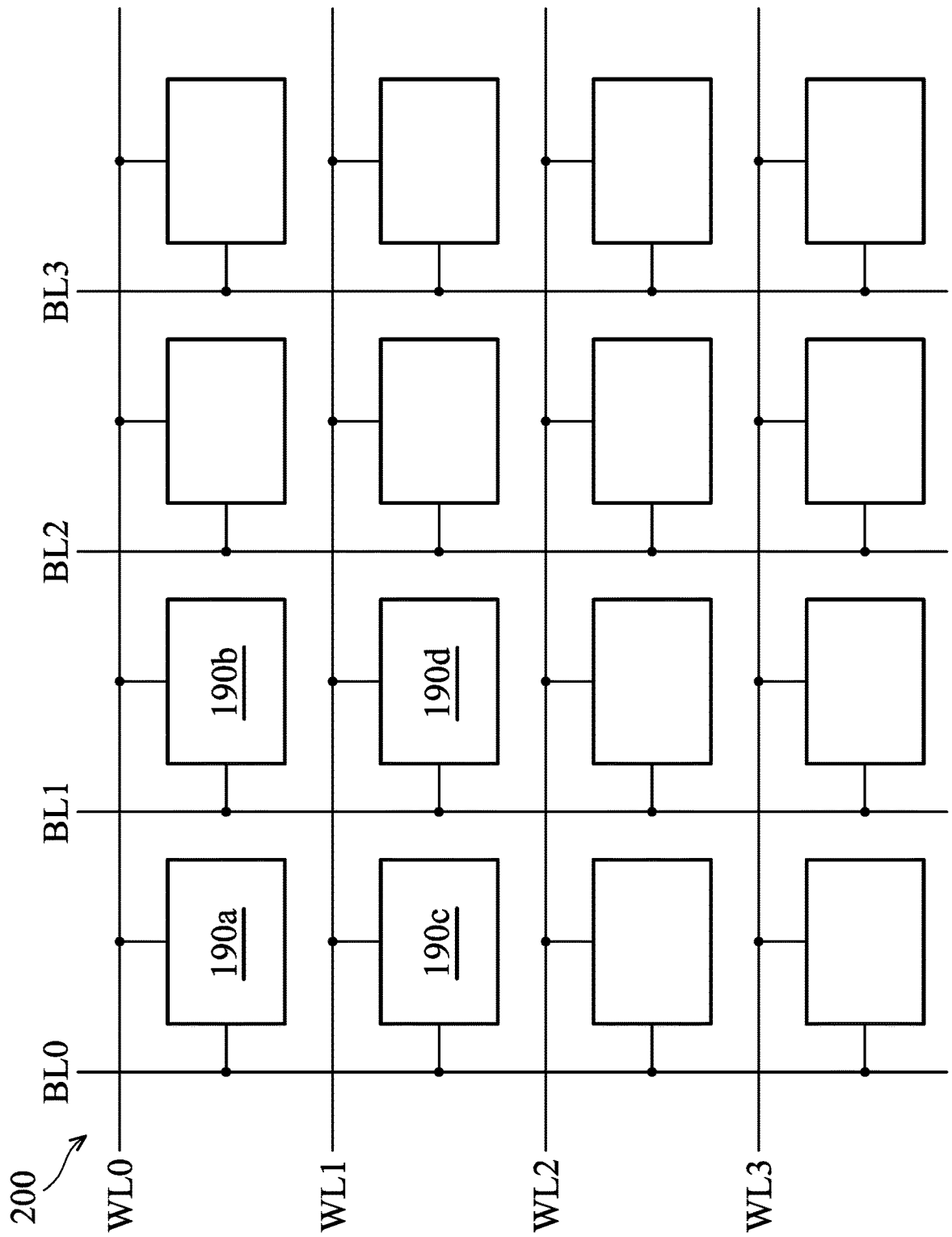
FIG. 1 illustrates a schematic diagram of a memory system including a number of memory cells in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

Some embodiments of the present disclosure are related to memory cells, memory system and methods of manufacturing thereof. Novel designs and structures of memory system comprising MTP NVMs will be described herein.

FIG. 1 illustrates a schematic diagram of a memory system 200 including a number of memory cells 190 in accordance with some embodiments. The memory system 200 has bit lines and word lines. For example, if the bit line BL1 and the word line WL1 are applied with certain voltages, the memory cell 190d will be selected to perform a write operation and/or a read operation.

However, if at least one of the other unselected memory cells 190a, 190b, and 190c generate leakage current, such leakage current may affect the electrons of the electronic elements of the selected memory cell 190d, so that the memory cell 190d may not function properly. Therefore, a novel memory cell is needed to prevent the leakage current of the memory cells 190a~190d, so that the selected memory cell could function properly on erase, write and/or read operations.

In some embodiments, the memory system 200 includes at least one memory array, and the memory array includes at least one memory cell 190. In other embodiments, each of the memory cells 190 is identical to each other. The novel memory cells 190 of MTP NVM described here have useful application in storing program code and/or data on system-on-chip (SOC) applications, as a substitute for external flash memory devices, or replacements for read-only memory (ROM) devices, programmable ROM (PROM) devices, erasable PROM (EPROM) devices, electrically erasable PROM (EEPROM) devices, and other types of memory devices, for example.

Figure 2:
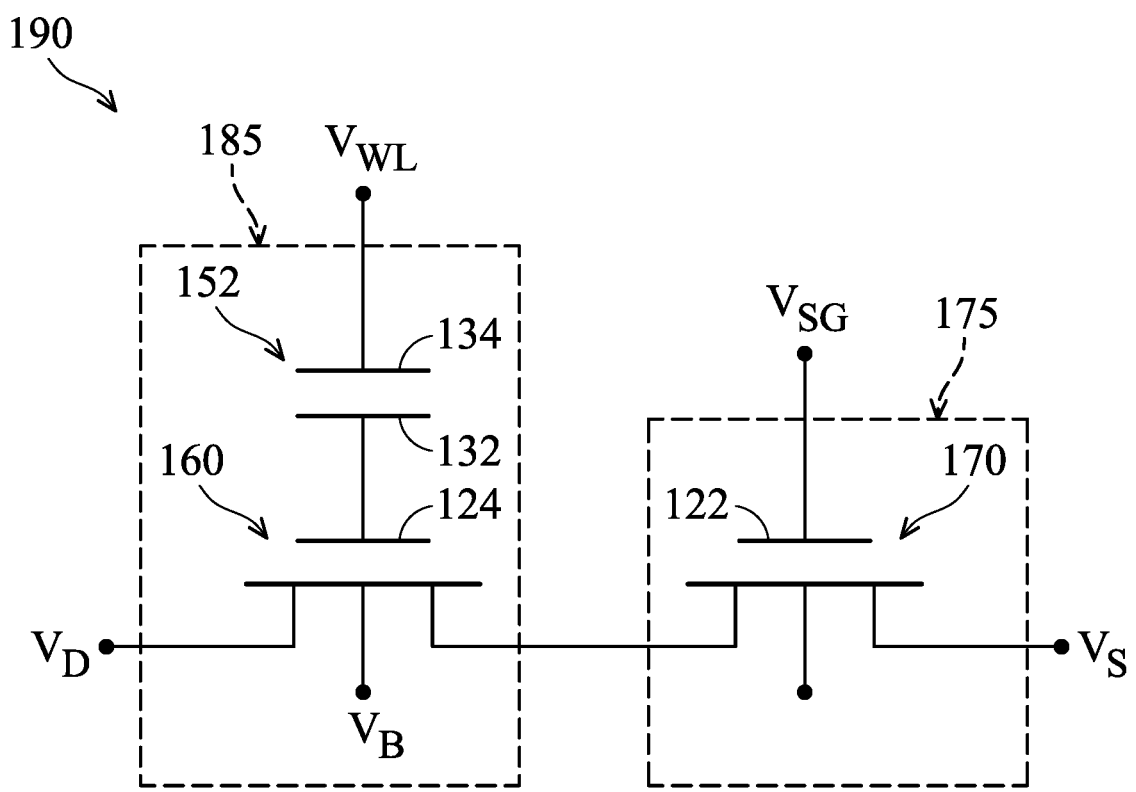
FIG. 2 illustrates a schematic diagram of the memory cell in accordance with some embodiments.

FIG. 2 illustrates a schematic of the memory cell 190 in accordance with some embodiments. Referring to FIG. 2, the memory cell 190 includes a memory 185 and a switch 175. In some embodiments, the memory 185 includes a capacitor 152 and a first transistor 160. The switch 175 includes a second transistor 170. When the memory cell 190 is not selected to perform a read operation, an erase operation or a write operation, switch 175 could be turned off so that the leakage current from the memory cell 185 cannot pass through. Therefore, there is almost no leakage current generated by the un-selected memory cell 190.

Specifically, the memory cell 190 includes a capacitor 152, a first transistor 160, and a second transistor 170. The capacitor 152 has a first plate (upper plate) 132 and a second plate (lower plate) 134. The capacitor 152 includes a metal-oxide-metal (MOM) capacitor, a metal-insulation-metal (MIM) capacitor, a capacitor-connected transistor, or a combination thereof. The first transistor 160 has a gate 124 electrically connected to the first plate 132 to form a floating gate. The gate 124 which could be the floating gate is adapted to store a data state indicative of a "1" or "0" in some embodiments, for example.

More specifically, some electrons will be trapped on the gate 124 as the data state. The first transistor 160 has a drain connected to the terminal VD, and has a source connected to the drain of the second transistor 170. Therefore, the second transistor 170 is coupled to the first transistor 160 in series. In addition, a terminal VB is coupled to the bulk or the substrate of the first transistor 160.

The second transistor 170 has a gate 122 connected to the terminal VSG, and has a drain connected to the source of the first transistor 160, and has a source connected to the terminal VS. The terminal VS is applied with a reference voltage or connected to the ground. The second transistor 170 is coupled to the first transistor 160 in series. In some embodiments, the first transistor 160 and the second transistor 170 are NMOS (N-Type Metal Oxide Semiconductor) transistors. The terminals VD, VWL, VSG, VS and VB may comprise conductive lines, contact pads, and/or terminals in upper levels of the memory cell 190 that are coupled to the various regions of the memory cell 190 using the contacts.

Such a memory cell 190 has a small size, but could have leakage current. Specifically, when the memory cell 190 is not selected, i.e. when the memory cell 190 is in an erase state but not selected to perform a read operation or on a write operation, some leakage currents will pass through the active region of the first transistor 160 voltage if there exists a voltage drop between terminals VD and VS. Therefore, it is desirable to find alternative mechanisms for the memory cell 190 to prevent leakage current.

In other embodiments, the memory cell 190 further includes a second transistor 170 connected to the first transistor 160 in series. If the memory cell 190 is not selected, then the second transistor 170 is turned off. Afterwards, even if some voltage drops between terminals VD and VS exist, since the second transistor 170 is turned off, there is no leakage current pass through the second transistor 170. Therefore, there is no leakage current from the memory cell 190 when it is not selected to perform a read operation or a write operation.

The operation of the memory cell 190, which includes erasing, programing and reading the memory cell 190 will be described next. Referring again to FIG. 2, the first transistor 160 and the second transistor 170 are turned on when the memory cell 190 is selected to perform a program operation which belongs to the write state. The gate 124 of the first transistor 160 is adapted to store a bit of information, and the bit of information is erasable with a first erase state and a second erase state both belonging to the write state.

In some embodiments, when the memory cell 190 is in the first erase state, the first transistor 160 is weakly turned on and the second transistor 170 is turned on, for example. When the memory cell 190 is in the second erase state, the first transistor 160 is weakly turned-on and the second transistor 170 is turned off. In addition, the first transistor 160 and the second transistor 170 are turned on when the memory cell 190 is on the read operation, for example. In other embodiments, the second transistor 170 is turned off when the memory cell 190 is not selected to perform a write operation or a read operation.

Figure 3A:
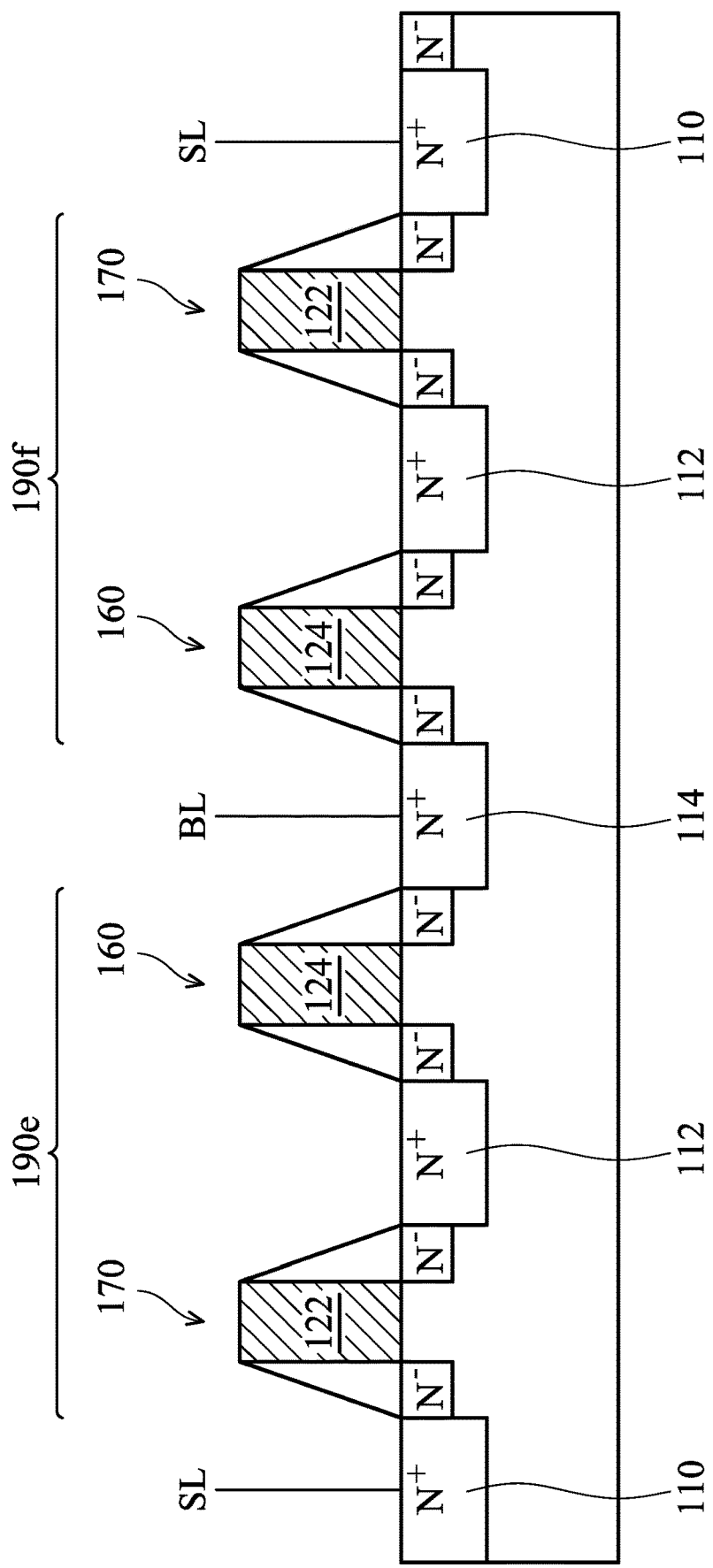
FIG. 3A is a cross-sectional view of a memory cell in accordance with some embodiments.
Figure 4:
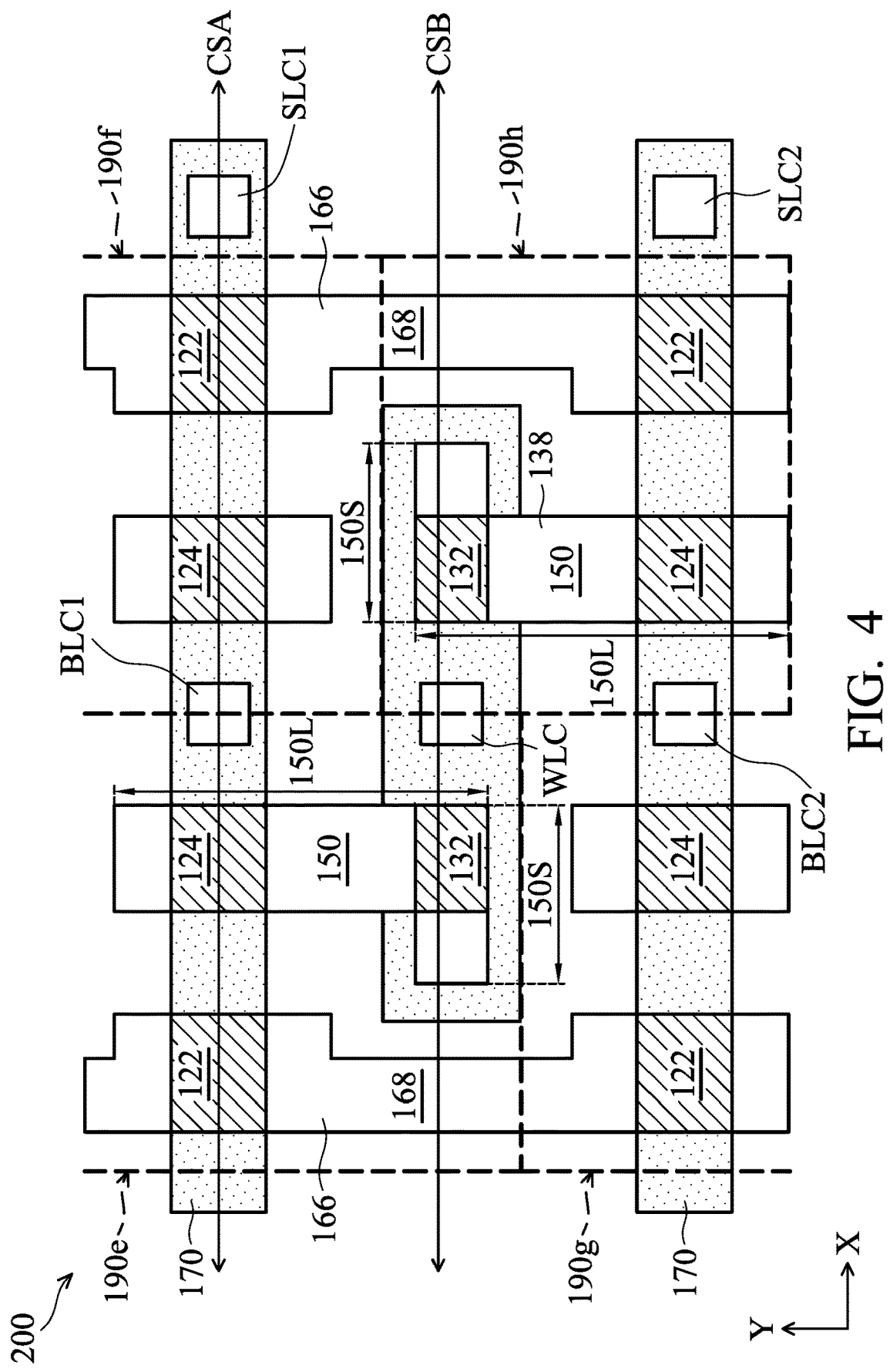
FIG. 4 illustrates a schematic diagram of a layout of the memory cell in accordance with some embodiments.

FIG. 3A is a cross-sectional view of the memory cells 190e and 190f in accordance with some embodiments. The cross section of the FIG. 3A corresponds to the cross line CSA as shown in FIG. 4. The memory cell 190e includes a first transistor 160 and a second transistor 170, and the memory cell 190f includes a first transistor 160 and a second transistor 170. The first transistor 160 and the second transistor 170 are formed over a P-type well 140, and the P-type well 140 is formed over a semiconductor substrate. In other embodiments, first transistor 160 and the second transistor 170 are formed over a P-type semiconductor substrate.

Specifically, the semiconductor substrate is a bulk semiconductor substrate, such as a semiconductor wafer. For example, the semiconductor substrate is a silicon wafer. The semiconductor substrate may include silicon or another elementary semiconductor material such as germanium. In some other embodiments, the semiconductor substrate includes a compound semiconductor. The compound semiconductor may include gallium arsenide, silicon carbide, indium arsenide, indium phosphide, another suitable material, or a combination thereof.

In some embodiments, the semiconductor substrate includes a semiconductor-on-insulator (SOI) substrate. The SOI substrate may be fabricated using a separation by implantation of oxygen (SIMOX) process, a wafer bonding process, another applicable method, or a combination thereof. In some embodiments, the semiconductor substrate is an un-doped substrate. However, in some other embodiments, the semiconductor substrate is a doped substrate such as a P-type substrate or an N-type substrate.

In some embodiments, the gates 122 and 124 are formed over the P-type well 140. Each of the gates 122 and 124 is made of poly-silicon, a metal material, another suitable conductive material, or a combination thereof. In some embodiments, the metal material may include, but is not limited to, copper, aluminum, tungsten, molybdenum, titanium, tantalum, platinum, or hafnium. In some embodiments, each of the gates 122 and 124 is a dummy gate electrode and will be replaced with another conductive material such as a metal material. The dummy gate electrode layer is made of, for example, poly-silicon. In some embodiments, spacers are formed over sidewalls of each of the gates 122 and 124. The spacers are made of silicon nitride, silicon oxy-nitride, silicon carbide, another suitable material, or a combination thereof.

In other embodiments, a gate dielectric layer could be formed between the P-type well 140 and the gate 122 or 124. The gate dielectric layer is made of silicon oxide, silicon nitride, silicon oxy-nitride, high-k material, another suitable dielectric material, or a combination thereof. In some embodiments, the high-k material may include, but is not limited to, metal oxide, metal nitride, metal silicide, transition metal oxide, transition metal nitride, transition metal silicide, transition metal oxy-nitride, metal aluminate, zirconium silicate, zirconium aluminate.

In some embodiments, a number of doped regions are formed in the P-type well 140. Specifically, the doped regions are doped with p-type dopants. For example, the doped regions are doped with boron or $BF_2$. In some embodiments, as shown I FIG. 3A, the doped regions 110, 112 and 114 are doped with n-type dopants. For example, the doped regions are doped with phosphor or arsenic. In some embodiments, some of the doped regions are p-type doped, and the other doped regions are n-type doped.

In the embodiments of FIG. 3A, the doped region 112 could be the source of the first transistor 160 and the drain of the second transistor 170. In other words, the source of the first transistor 160 is connected to the drain of the second transistor 170. In addition, the doped region 110 could be the source of the second transistor 170. Furthermore, the doped region 114 could be the drain of the first transistor 160.

In some embodiments, a bit line BL is connected to the doped region 114. The bit line BL may be connected to the doped region 114 through a bit line contact, which is arranged between the bit line and the doped region 114. In other words, the bit line BL is connected to the drain of the first transistor 160. In addition, a source line SL is connected to the doped region 110. The source line SL may be connected to the doped region 110 through a source line contact, which is arranged between the source line and the doped region 110. In other words, the source line SL is connected to the source of the second transistor 170.

Figure 3B:
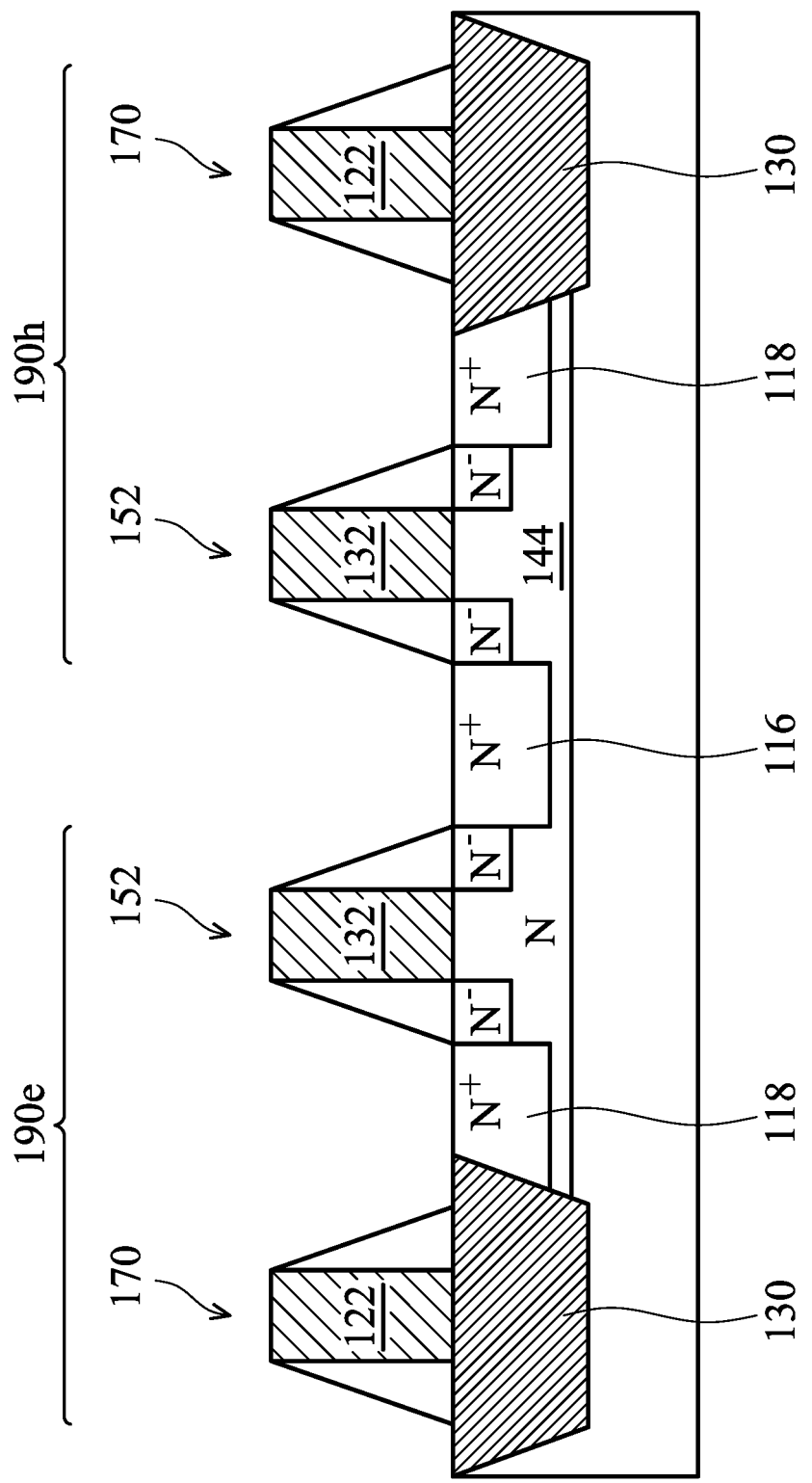
FIG. 3B is another cross-sectional view of a memory cell in accordance with some embodiments.

FIG. 3B is another cross-sectional view of a memory cell 190 in accordance with some embodiments. The cross section of the FIG. 3B corresponds to the cross line CSB as shown in FIG. 4. The memory cell 190e includes a capacitor 152 and a second transistor 170, and the memory cell 190h includes a capacitor 152 and a second transistor 170. The capacitor 152 and the second transistor 170 are formed over a P-type well 140, and the P-type well 140 is formed over a semiconductor substrate. In other embodiments, the capacitor 152 and the second transistor 170 are formed over a P-type semiconductor substrate.

In some embodiments, the first plate 132 and the gate 122 are formed over the P-type well 140. The first plate 132 is made of poly-silicon, a metal material, another suitable conductive material, or a combination thereof. In some embodiments, the metal material may include, but is not limited to, copper, aluminum, tungsten, molybdenum, titanium, tantalum, platinum, or hafnium.

In some embodiments, a number of doped regions are formed in the P-type well 140. Specifically, the doped regions are doped with p-type dopants. For example, the doped regions are doped with boron or BF2. In some embodiments, as shown I FIG. 3B, the doped regions 116, 118 and 144 are doped with n-type dopants. For example, the doped regions are doped with phosphor or arsenic.

More specifically, the doped regions 116, 118 and 144 are formed between two isolation regions 130. In some embodiments, the isolation region 130 includes a shallow trench isolation (STI) feature, a local oxidation of silicon (LOCOS) feature, another suitable isolation structure, or a combination thereof. In some embodiments, the isolation region 130 has a multi-layer structure. In some embodiments, the isolation region 130 is made of a dielectric material. The dielectric material may include silicon oxide, silicon nitride, silicon oxy-nitride, fluoride-doped silicate glass (FSG), low-K dielectric material, another suitable material, or a combination thereof.

In the embodiments of FIG. 3B, the doped regions 116 and 118 are surrounded by the doped region 144. Since the doped region 144 is conductive, the doped region 144 could be the lower plate of the capacitor 150. In other words, the lower plate of the capacitor 150 is disposed in the conductive region (i.e., the doped region 144 and/or doped regions 116, 118) over a semiconductor substrate.

In some embodiments, a word line WL is connected to the doped region 116. The word line WL may be connected to the doped region 116 through a word line contact, which is arranged between the word line and the doped region 116. In other embodiments, the word line WL is connected to the conductive region over the P-type well 140. In other words, the word line WL is connected to the lower plate of the capacitor 152.

FIG. 4 illustrates a schematic diagram of a layout of the memory system 200 in accordance with some embodiments. A plurality of memory cells 190e, 190g, 190g and 190h are included by the memory system 200. The memory cells 190e and 190f are arranged along the X direction, and the memory cells 190e and 190g are arranged along the Y direction.

As shown in FIG. 4, multiple memory cells 190e, 190f, 190g and 190h are interlocked with each other. The memory cells 190e, 190f, 190g and 190h are adjacent to each other in an interlocked manner. In other words, the memory cells 190e~190h are arranged in a staggered manner along X direction (the first direction), and are also arranged in a staggered manner along Y direction (the second direction).

In some embodiments, each of the memory cells 190e~190h includes a capacitor, a first transistor and a second transistor. As shown in FIG. 4, the layout pattern of each of the memory cell 190e includes the gate 122 of the second transistor, the gate 124 of the first transistor, and upper plate 132 of the capacitor. It should be noted that the memory cell 190e also include drain/source of the first transistor, drain/source of the second transistor, the lower plate of the capacitor, spacers, and so on, which are not illustrated in FIG. 4. The layout pattern of each of the memory cell 190h includes the gate 122 of the second transistor, the gate 124 of the first transistor, and upper plate 132 of the capacitor.

It should be noted that the cross section of the FIG. 3A corresponds to the cross line CSA as shown in FIG. 4. The cross line CSA passes through the gates 122 and 124 of the memory cells 190e and 190f. In addition, the cross section of the FIG. 3B corresponds to the cross line CSB as shown in FIG. 4. The cross line CSB passes through the upper plates 132 of the memory cells 190e and 190h.

In some embodiments, the gates 122 and 124 are formed over the active region 170. The upper plate 132 is formed over the active region 172. The active region 172 is separated with the active region 170. In other words, the active region 170 is not connected to the active region 172. The active region is a conductive region made of material with P-type dopants or N-type dopants for conducting electronic charges.

Furthermore, the bit line contacts BLC1 and BLC2 are formed over the active region 170. Each of the bit line contacts BLC1 and BLC2 are arranged between the two gates 124. The bit line contacts BLC1 are BLC2 are utilized to connect a bit line and the active region 170. The source line contacts SLC1 and SLC2 are formed over the active region 170. The source line contacts SLC1 and SLC2 are utilized to connect a source line and the active region 170. The word line contact WLC is formed over the active region 172. The word line contact WLC is arranged between the upper plates 132. The word line contact WLC is utilized to connect a word line and the active region 172.

In some embodiments, as shown in FIG. 4, the gate 124 and the upper plate 132 are connected through a poly-silicon segment 150. The gate 124, the upper plate 132 and the poly-silicon segment 150 are formed in an L-shaped pattern 138. The L-shaped pattern 138 includes a long side 150L and a short side 150S. The long side 150L is arranged along the Y direction, and the short side 150S is arranged along the X direction. In other words, the long side 150L is perpendicular to the short side 150S.

In addition, the two short sides 150S of the memory cells 190e and 190h are arranged in alternative side of the word line contact WLC over the active region 172. In some embodiments, the two short sides 150S of the memory cells 190e and 190h are arranged along the X direction, and the two short sides 150S of the memory cells 190e and 190h extend towards opposite directions. The short side 150S of the memory cell 190h extend toward the X direction, and the short side 150S of the memory cell 190e extend toward the −X direction which is opposite to the X direction.

In some embodiments, the two long sides 150L of the memory cells 190e and 190h are arranged along the Y direction, and the two long sides 150L of the memory cells 190e and 190h extend towards the same direction. The long side 150L of the memory cell 190e extend toward the Y direction, and the long side 150L of the memory cell 190h extend toward the Y direction.

It should be noted that the gate 124, the upper plate 132 and the poly-silicon segment 150 of each of the memory cells 190e~190h are formed in an L-shaped pattern 138. Compared to other layout patterns with straight-line pattern, the layout pattern of the memory cell of the disclosure is more dense and compact. Therefore, the area of the layout pattern of the memory cells 190e~190h could be reduced.

In some embodiments, the gates 122 of the memory cells 190e and 190g are connected by a poly-silicon segment 168. Specifically, due to the arrangement of the upper plate 132, the width of the poly-silicon segment 168 is less than the width of the gate 122. The width is measured along the X direction. The gates 120 and the poly-silicon segment 168 are formed in a continuous pattern 166 extending along the Y direction. In other words, the continuous pattern 166 stretches across several memory cells along the Y direction.

In some embodiments, as shown in FIG. 4, the bit line contact BLC1 is shared by the two adjacent memory cells 190e and 190f along the direction X. The bit line contact BLC2 is shared by the two adjacent memory cells 190g and 190h along the direction X. In other words, the bit line contact BLC1 is connected to the two first transistors of the memory cells 190e and 190f through the active region 170. The bit line contact BLC2 is connected to the two first transistors of the memory cells 190g and 190h through the active region 170.

Because each of the bit line contacts is shared by the two adjacent memory cells, the amount of the bit line contacts could be reduced. Compared with the embodiments in which the respective memory cells have a respective bit line contact, the amount of the bit line contacts is reduced about 50%. Therefore, the arrangement of the bit lines could be simplified to reduce cost and layout area.

In some embodiments, as shown in FIG. 4, the word line contact WLC is shared by the two adjacent memory cells 190e and 190h along the direction X. In other words, the word line contact WLC is connected to the two capacitors of the memory cells 190e and 190h through the active region 172.

Figure 5:
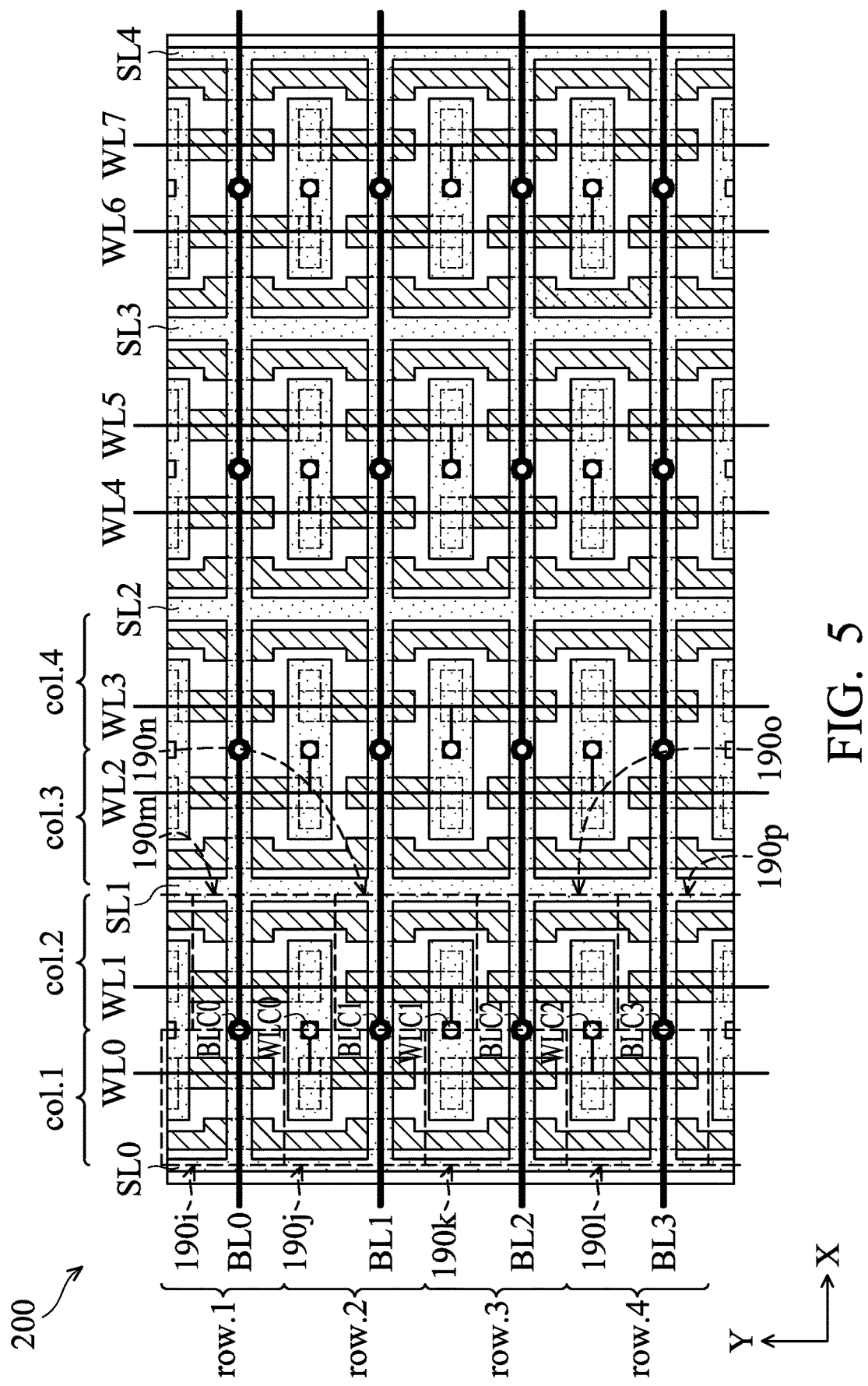
FIG. 5 illustrates a schematic diagram of a layout of the memory cell in accordance with some embodiments.

FIG. 5 illustrates a schematic diagram of a layout of the memory system 200 in accordance with some embodiments. The memory system 200 includes a number of memory cells 190i~190p. The memory cells 190i~190p are interlocked with each other in rows (X direction) and columns (Y direction). As shown in FIG. 5, the memory cells 190i, 190j, 190k and 190l are arranged in the col.1, the memory cells 190m, 190n, 190o and 190p are arranged in the col.2. The memory cell 190i is arranged in the row.1, the memory cell 190j is arranged in the row.2, and the memory cell 190k is arranged in the row.3, and so on.

However, the memory cells in col.1 and col.2 are interlocked with each other. Specifically, the memory cell 190m is arranged across the row.1 and row.2, rather than arranged completely in the row.1 or row.2. The memory cell 190n is arranged across the row.2 and row.3, rather than arranged completely in the row.2 or row.3, and so on.

A number of bit lines BL0~BL3 are arranged to extend along the X direction, and they are formed over the conductive region (i.e, the active region 170). The bit lines BL0~BL3 are connected to the memory cells 190i~190p through the bit line contacts. For example, the bit line contact BLC0 of the bit line BL0 is connected to the first transistors of the memory cells 190i and 190m. The bit line contact BLC1 of the bit line BL1 is connected to the first transistors of the memory cells 190j and 190n, and so on.

In some embodiments, multiple word lines WL0~WL7 are arranged to extend along the Y direction, and they are formed over the conductive region (i.e, the active region 170). The word lines WL0~WL7 are connected to the memory cells 190i~190p through the word line contacts. For example, the word line contact WLC0 of the word line WL0 is connected to the capacitors of the memory cells 190j and 190m. The word line contact WLC1 of the word line WL1 is connected to the capacitors of the memory cells 190k and 190n, and so on.

In some embodiments, multiple source lines SL0~SL4 are arranged to extend along the Y direction, and they are formed over the conductive region (i.e, the active region 170). The source lines SL0~SL4 are connected to the memory cells 190i~190p through the source line contacts. In some embodiments, some of the source lines SL0~SL4 is arranged between two sets of two adjacent word lines WL0~WL7. As shown in FIG. 5, the source line SL1 is arranged between the set of word lines WL0~WL1 and another set of word lines WL2~WL3. The source line SL2 is arranged between the set of word lines WL2~WL3 and another set of word lines WL4~WL5, and so on.

In accordance with some embodiments, a memory system is provided. The memory system includes a number of memory cells and a number of bit lines. The memory cells are interlocked with each other in rows and columns. The memory cells include respective capacitors, respective first transistors and respective second transistors. Respective upper plates of the respective capacitors are electrically connected to respective gates of the respective first transistors, and respective drains of the respective second transistors are connected to respective sources of the respective first transistors. The bit lines are arranged along an extending direction of the rows. Respective bit lines are connected to the respective first transistors through respective bit-line contacts, and each of the respective bit-line contacts is shared by two adjacent memory cells of the extending direction of the rows.

In accordance with some embodiments, a memory system is provided. The memory system includes a number of memory cells and a number of bit lines. The memory cells are arranged in a staggered manner along a first direction and a second direction which is perpendicular to the first direction. The memory cells include respective capacitors, respective first transistors and respective second transistors. Each of the respective second transistors is utilized to turn off the respective memory cell when the respective memory cell is not selected to perform a write operation or a read operation. The bit lines are arranged along the first direction. Respective bit lines are connected to the respective memory cells through respective bit-line contacts, and each of the respective bit-line contacts is connected to the respective first transistors of two adjacent memory cells along the first direction.

In accordance with some embodiments, a memory cell is provided. The memory cell includes a capacitor, a first transistor and a second transistor. The capacitor includes an upper plate and a lower plate. The gate of the first transistor is connected to the upper plate, a bit-line contact is connected to a drain of the first transistor and a drain of another first transistor of a second memory cell which is identical to the memory cell, and the bit-line contact is utilized for connecting the memory cell and a bit line. A drain of the second transistor is connected to a source of the first transistor, the upper plate of the capacitor is connected to the gate of the first transistor through a poly-silicon segment, and the upper plate, the poly-silicon segment and the gate of the first transistor are formed in a L-shaped pattern. The bit line is arranged along a first direction, the memory cell and the second memory cell are arranged in the first direction in a staggered manner, a source line is connected to a source of the second transistor, and the source line is arranged along a second direction which is perpendicular to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system, comprising:
  a plurality of memory cells interlocked with each other in rows and columns, wherein the memory cells including respective capacitors, respective at least two transistors, respective upper plates of the respective capacitors are electrically connected to respective gates of the respective first transistors of the at least two transistors, and respective drains of the respective second transistors of the at least two transistors are connected to respective sources of the respective first transistors, and the respective first transistors are different from the respective second transistors; and
  a plurality of bit lines, arranged along an extending direction of the rows, wherein respective bit lines are connected to the respective first transistors through respective bit-line contacts; and
  a plurality of word lines, wherein respective word lines are connected to the respective capacitors through respective word-line contacts,
  wherein the respective bit-line contact of a first memory cell of the memory cells is shared with a second memory cell of the memory cells, and the respective word-line contact of the first memory cell is shared with a third memory cell of the memory cells,
  wherein the first memory cell is in a first column, and the second and third memory cells are in direct contact in a second column.

2. The memory system as claimed in claim 1, wherein respective lower plates of the respective capacitors of the two adjacent memory cells are disposed in the same conductive region that is formed by a doped region over a semiconductor substrate.

3. The memory system as claimed in claim 1, further comprising:
  a plurality of source lines, arranged in parallel with the word lines, wherein each of the source lines is arranged between two sets of two adjacent word lines.

4. The memory system as claimed in claim 1, wherein the respective upper plates of the respective capacitor are electrically connected to respective gates of the respective first transistors through respective poly-silicon segments, and each of the respective upper plates, the respective gates and the respective poly-silicon segments are formed in respective L-shaped pattern, and respective gates of the second transistors are isolated from the respective gates of the first transistors.

5. The memory system as claimed in claim 4, wherein respective long side of the respective L-shaped pattern is parallel with the extending direction of the columns, and respective short side of the L-shaped pattern is parallel with the extending direction of the rows.

6. The memory system as claimed in claim 5, wherein respective short sides of two adjacent L-shaped pattern arranged in alternative side of the respective word-line contact.

7. The memory system as claimed in claim 1, wherein respective gates of the respective second transistors are formed in a continuous pattern along the extending direction of the columns, and each of the respective bit-line contacts is shared by the respective first transistors of two adjacent memory cells of the extending direction of the rows.

8. The memory system as claimed in claim 1, wherein each of the respective second transistors is utilized to turn off the respective memory cell when the respective memory cell is not selected to perform a write operation or a read operation.

9. The memory system as claimed in claim 1, wherein the first memory cell is in contact with the second memory cell and the third memory cell.

10. A memory system, comprising:
  a plurality of memory cells, arranged in a staggered manner along a first direction and a second direction which is perpendicular to the first direction, wherein the memory cells including respective capacitors, respective at least two transistors comprising respective first transistors and respective second transistors which are different from the respective first transistors, each of the respective second transistor is utilized to turn off the respective memory cell when the respective memory cell is not selected to perform a write operation or a read operation;
  a plurality of bit lines, arranged along the first direction, wherein respective bit lines are connected to the respective memory cells through respective bit-line contacts; and
  a plurality of word lines, wherein respective word lines are connected to the respective capacitors through respective word-line contacts,
  wherein respective lower plates of the respective capacitors of two adjacent memory cells are disposed in the same doped region over a semiconductor substrate, and each of the respective word-line contacts is positioned between respective upper plates of the respective capacitors of the two adjacent memory cells and directly on the same doped region, wherein the respective bit-line contact of a first memory cell of the memory cells is shared with a second memory cell of the memory cells, and the respective word-line contact of the first memory cell is shared with a third memory cell of the memory cells, wherein the first memory cell is in a first column, and the second and third memory cells are in direct contact in a second column.

11. The memory system as claimed in claim 10, wherein the respective upper plates of the respective capacitors are electrically connected to respective gates of the respective first transistors, and respective drains of the respective second transistors are connected to respective sources of the respective first transistors.

12. The memory system as claimed in claim 10, further comprising:

a plurality of source lines, arranged along the second direction, wherein each of the source lines is arranged between two sets of two adjacent word lines.

13. The memory system as claimed in claim 10, wherein the respective upper plates of the respective capacitors is electrically connected to respective gates of the respective first transistors through respective poly-silicon segments, and the respective upper plates, the respective gates and the respective poly-silicon segments are formed in respective L-shaped patterns.

14. The memory system as claimed in claim 13, wherein respective long sides of the respective L-shaped patterns are parallel with the second direction, and respective short sides of the L-shaped patterns are parallel with the first direction.

15. The memory system as claimed in claim 14, wherein the respective short sides of the two adjacent L-shaped patterns along the first direction extend toward opposite directions, and the respective long sides of the two adjacent L-shaped patterns along the second direction extend toward the same direction.

16. The memory system as claimed in claim 10, the first memory cell is in contact with the second memory cell and the third memory cell.

17. A memory cell, comprising:

a capacitor, comprising an upper plate and a lower plate;

a first transistor, wherein a gate of the first transistor is connected to the upper plate, a bit-line contact is connected to a drain of the first transistor and a drain of another first transistor of a second memory cell which is identical to the memory cell, and the bit-line contact is utilized for connecting the memory cell and a bit line; and a second transistor, wherein a gate of the second transistor is isolated from the gate of the first transistor, a drain of the second transistor is connected to a source of the first transistor, the upper plate of the capacitor is connected to the gate of the first transistor through a poly-silicon segment, and the upper plate, the poly-silicon segment and the gate of the first transistor are formed in a L-shaped pattern, wherein a word line is connected to the capacitor through a word-line contact, and the word-line contact is positioned on an interface between the memory cell and a third memory cell other than the second memory cell, wherein the word-line contact is connected to the lower plate of the capacitor and a lower plate of another capacitor of the third memory cell, and the word-line contact is utilized for connecting the memory cell and the word line, wherein the memory cell, the second memory cell and the third memory cell are in contact with each other.

18. The memory cell as claimed in claim 17, wherein the bit line is arranged along a first direction, the memory cell and the second memory cell are arranged in the first direction in a staggered manner, a source line is connected to a source of the second transistor, and the source line is arranged along a second direction which is perpendicular to the first direction.

19. The memory cell as claimed in claim 18, wherein the lower plate of the capacitor is disposed in a conductive region over a semiconductor substrate, a word line is connected to the lower plate of the capacitor, and the word line is arranged along the second direction.

20. The memory cell as claimed in claim 18, wherein a long side of the L-shaped pattern is parallel with the second direction, a short side of the L-shaped pattern is parallel with the first direction, the short side and a short side of the second memory cell extend toward opposite directions, and the long side and a long side of the second memory cell extend toward opposite directions.

* * * * *